United States Patent
Yang et al.

(10) Patent No.: US 9,312,449 B2
(45) Date of Patent: Apr. 12, 2016

(54) LIGHT-EMITTING DEVICE WITH REFLECTING ELECTRODE

(71) Applicant: XIAMEN SANAN OPTOELECTRONICS TECHNOLOGY CO., LTD., Xiamen (CN)

(72) Inventors: Lixun Yang, Xiamen (CN); Junpeng Shi, Xiamen (CN); Xinghua Liang, Xiamen (CN); Gaolin Zheng, Xiamen (CN); Zhibai Zhong, Xiamen (CN); Shaohua Huang, Xiamen (CN); Chih-Wei Chao, Xiamen (CN)

(73) Assignee: XIAMEN SANAN OPTOELECTRONICS TECHNOLOGY CO., LTD., Xiamen (CN)

( * ) Notice: Subject to any disclaimer, the term of this patent is extended or adjusted under 35 U.S.C. 154(b) by 0 days.

(21) Appl. No.: 14/641,424

(22) Filed: Mar. 8, 2015

(65) Prior Publication Data

US 2015/0179889 A1 Jun. 25, 2015

Related U.S. Application Data

(63) Continuation of application No. PCT/CN2013/084590, filed on Sep. 29, 2013.

(30) Foreign Application Priority Data

Oct. 31, 2012 (CN) .......................... 2012 1 0426841

(51) Int. Cl.
| | |
|---|---|
| H01L 33/14 | (2010.01) |
| H01L 33/40 | (2010.01) |
| H01L 33/62 | (2010.01) |
| H01L 33/38 | (2010.01) |

(52) U.S. Cl.
CPC .............. *H01L 33/405* (2013.01); *H01L 33/62* (2013.01); *H01L 33/145* (2013.01); *H01L 33/38* (2013.01)

(58) Field of Classification Search
CPC ....... H01L 33/145; H01L 33/405; H01L 33/62
See application file for complete search history.

(56) References Cited

U.S. PATENT DOCUMENTS

| | | | |
|---|---|---|---|
| 6,794,690 B2 | 9/2004 | Uemura | |
| 6,946,685 B1 | 9/2005 | Steigerwald | |
| 7,479,663 B2* | 1/2009 | Urashima | ............. H01L 33/405 |
| | | | 257/103 |
| 8,017,967 B2* | 9/2011 | Suehiro | ............... H01L 23/3121 |
| | | | 257/734 |

(Continued)

FOREIGN PATENT DOCUMENTS

JP 2008140841 A 6/2008

*Primary Examiner* — Thanh V Pham
(74) *Attorney, Agent, or Firm* — Syncoda LLC; Feng Ma; Junjie Feng

(57) ABSTRACT

An electrode structure for effectively improving the stability of a semiconductor LED includes a reflecting layer capable of current spreading. In such an electrode structure, the current injects from the side surface of the reflecting layer to form a certain potential gradient over the contact surface between the electrode and the LED contact surface, thereby inhibiting the metal ion of the reflecting layer from migration due to electric field during usage, thereby improving device stability. In addition, the electrode portion for current injection can include a high-reflectivity material yet not vulnerable to ion migration, thereby increasing the entire reflecting area and improving luminous efficiency.

12 Claims, 11 Drawing Sheets

(56) References Cited

U.S. PATENT DOCUMENTS 8,410,490 B2 * 4/2013 Denbaars .............. H01L 33/145
257/103

2013/0020599 A1 * 1/2013 Han ........................ H01L 33/38
257/98

2013/0126919 A1 * 5/2013 Yamasaki ............... H01L 33/44
257/94

* cited by examiner

LIGHT-EMITTING DEVICE WITH REFLECTING ELECTRODE

CROSS-REFERENCE TO RELATED APPLICATIONS

The present application is a continuation of, and claims priority to, PCT/CN2013/084590 filed on Sep. 29, 2013, which claims priority to Chinese Patent Application No. 201210426841.X filed on Oct. 31, 2012. The disclosures of these applications are hereby incorporated by reference in their entirety.

BACKGROUND

The basic structures of a light-emitting diode (LED) include a p-type semiconductor layer, an active layer (light-emitting layer) and an n-type semiconductor layer. When the LED is under forward bias, the hole in the p region moves towards the n region and the electron in the n region moves towards the p region. The electron and the hole are recombined in the active layer. In theory, the energy generated from the electron and hole recombination is mostly released by light (radiative transition). It can be seen that the LED can directly transfer the electricity into light, and has such advantages as high energy conversion efficiency and small volume. In addition, the LED is free of poisonous and harmful substances and meets environmental and sustainable development requirement. The LED has broad market development prospect thanks to low energy consumption, environmental protection, small volume and long service life.

SUMMARY

The present disclosure provides a light-emitting device with reflecting electrode, which generates potential gradient on the contact surface between the electrode and semiconductor by controlling electrode current direction to inhibit metal migration and improve LED stability.

According to a first aspect of the present disclosure, a light-emitting device, comprising, a semiconductor structure with several semiconductor layers, and a light-emitting layer is arranged between semiconductor layers; at least one electrode with a reflecting layer having a contact surface with at least one semiconductor layer of the semiconductor structure; when forward bias is applied to the light-emitting device, the current flows to the reflecting layer from its side, making the contact surface between the electrode and the semi-conductor layer generate potential gradient, thus inhibiting the electrode metal from electromigration.

In some embodiments, the electrode also comprises a current steering layer; when the forward bias is applied, the current flows to the reflecting layer through the current steering layer surrounding the reflecting layer. The potential of the contact surface between the current steering layer and the semiconductor is higher than the potential of the contact surface between the reflecting layer and the semiconductor. Further, the current steering layer is a multi-layer structure, containing high reflectivity material (e.g., Al) not vulnerable to electromigration.

In some embodiments, the portion of the electrode surface not for conducting is covered by insulating material.

According to a second aspect of the present disclosure, a light-emitting device is provided, comprising a semiconductor structure that comprises a p-type semiconductor layer, an n-type semiconductor layer and a light-emitting layer between the P layer and the N layer; an electrode that comprises a current injection layer, a current steering layer and a reflecting layer, wherein, the current steering layer is located at the periphery of the reflecting layer and at least a portion of the layer has a contact surface with the reflecting layer; in the case of forward conduction, the current flows to the reflecting layer through the current steering layer surrounding the reflecting layer, making the contact surface generate potential gradient, thus inhibiting the electrode metal from electromigration.

More specifically, the electrode comprises three portions, namely, a current injection layer, a current steering layer and a reflecting layer. The reflecting layer and the current steering layer at least have a portion in contact with the p-type semiconductor. The side surface of the reflecting layer contacts with the side surface of the current steering layer. The current steering layer at least has a portion of surface in contact with the current injection layer. In the case of forward conduction, the current flow direction in the electrode is: the current injection layer, the current steering layer and the reflecting layer in successive. Therefore, the potential of the current steering layer is higher than the reflecting layer and such potential difference would inhibit the metal ion migration in the reflecting layer, thus improving device stability.

In some embodiments, the side surfaces of the current steering layer and the reflecting layer are completely contacted and the upper surface of the current steering layer is a plane surface. The current injection layer is separated from the reflecting layer. The current injection layer contacts with portion of the upper surface of the current steering layer and the insulating protective layer is distributed over the electrode surface not requiring current conduction.

In some embodiments, the side surfaces of the current steering layer and the reflecting layer are completely contacted and the section of the current steering layer has a certain gradient. The current injection layer is separated from the reflecting layer. The current injection layer only contacts with the lower portion of the current steering layer. The insulating protective layer is distributed over the electrode surface not requiring current conduction.

In some embodiments, the portion of the adjacent side surfaces of the current steering layer and the reflecting layer approaching to the semiconductor layer is blocked by insulating material, and the remaining portions are mutually contacted. The section of the current steering layer has a certain gradient. The current injection layer is separated from the reflecting layer. The current injection layer only contacts with the lower portion of the current steering layer. The insulating protective layer is distributed over the electrode surface not requiring current conduction.

In some embodiments, the current steering layer is made of at least 2 layers of material, and at least one layer contains material not vulnerable to electromigration with reflectivity above 75%.

In another aspect, a light-emitting system is provided including a plurality of light-emitting devices disclosed herein. In another aspect, a method of fabricating the light-emitting devices is provided. For example, the electrode structure can be fabricated by the methods described below.

According to an embodiment of present disclosure, deposit a reflecting layer over the p-type semiconductor via photo-etching, evaporation or sputtering. Deposit a current steering layer over the side surface of the reflecting layer via photo-etching, evaporation or sputtering, and the two layers are at least partially contacted. Deposit a current injection layer over the upper surface of the current steering layer via photo-etching, evaporation or sputtering.

According to another embodiment of present disclosure, deposit a current steering layer over the side surface of the reflecting layer via photoetching, evaporation or sputtering. Deposit a reflecting layer over the upper surface of the p-type semiconductor via photoetching, evaporation or sputtering, and the reflecting layer has at least a portion in contact with the steering layer. Deposit a current injection layer over the upper surface of the current steering layer via photoetching, evaporation or sputtering.

In some embodiments, the current firstly flows to the current injection layer, then to the current steering layer and finally reaches the reflecting layer, thus guaranteeing that the potential of the reflecting layer is lowest. High potential surrounding the reflecting layer would inhibit the cation in the reflecting layer from out-migration, thereby improving device stability. Further, the current steering layer may contain material not vulnerable to electromigration with reflectivity >75% to make up such area loss in the reflecting layer.

Figure 1:
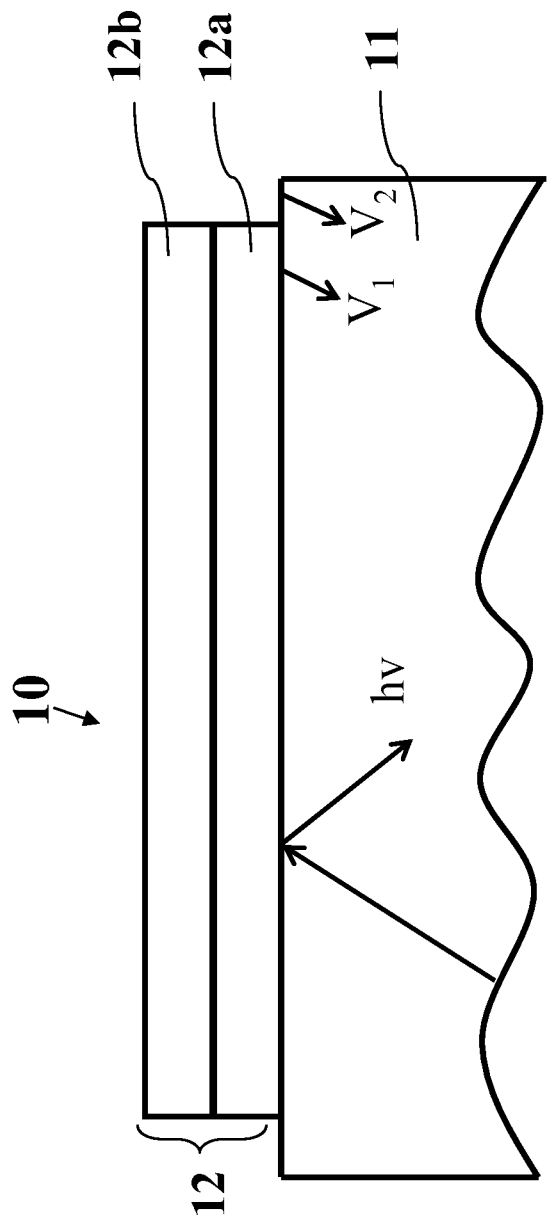
FIG. 1 is a local cross-sectional view of a structure of an existing LED chip with a high-emissivity p electrode.

In the drawings:
10, 30: LED chip;
11, 31, 82, 92: p-type semiconductor layer;
12: p electrode;
12a: reflecting layer;
12b: bonding layer;
12c: migration barrier layer;
32: current injection layer;
33, 36, 84: insulation layer;
34: current steering layer;
35: reflecting layer;
72: first metal layer;
73: second metal layer;
83, 93: active layer;
84, 94: n-type semiconductor;
85, 95: substrate;
96: n electrode;
97, 98: patterned metal layer.

DETAILED DESCRIPTION

In an LED, as the active layer has random light emitting direction, the light emitting is often improved through design of the reflecting layer in actual device. FIG. 1 is a local cross-section structure diagram of an LED chip 10 with high-emissivity p electrode 12. In such structure, the p electrode 12 contacts with the p-type semiconductor 11. The electrode 12 at least comprises a reflecting layer 12a containing high reflectivity metal material. The reflecting layer 12a can be a layer of high reflectivity metal material or be made of several layers of material, including alloy material. The most common high reflectivity metal materials include Ag and Al. Another layer 12b is made of Cr, Pt or Au for the convenience of later wire bonding or bonding process.

As shown in FIG. 1, the photon hv emitted from the active layer (not shown in the figure) is reflected by the 12a, thus increasing the light emitting of the n surface. In addition, with current spreading function, the layer 12a makes the current spread to the entire p-type semiconductor surface, thus improving the current distribution evenness and improving the luminous efficiency. However, also as shown in FIG. 1, potential gradient $V_1 > V_2$ exists near the electrode. Some metal material in layer 12a may be migrated under the potential difference, thereby reducing the stability in use of the entire LED chip 10. For example, in case of forward conduction, the Ag in the layer 12a would be partially oxidized to Ag+ ion; moves towards to the low potential under the electric field; captures electron at a low potential place and is reverted to Ag, which is called Ag electromigration. Despite this slow electromigration, if a small number of Ag passes through the active layer and migrates to the n surface, the LED chip would suffer electric leakage and even short circuit. Therefore, measures are required to inhibit such electromigration so as to improve service life of the device.

Figure 2:
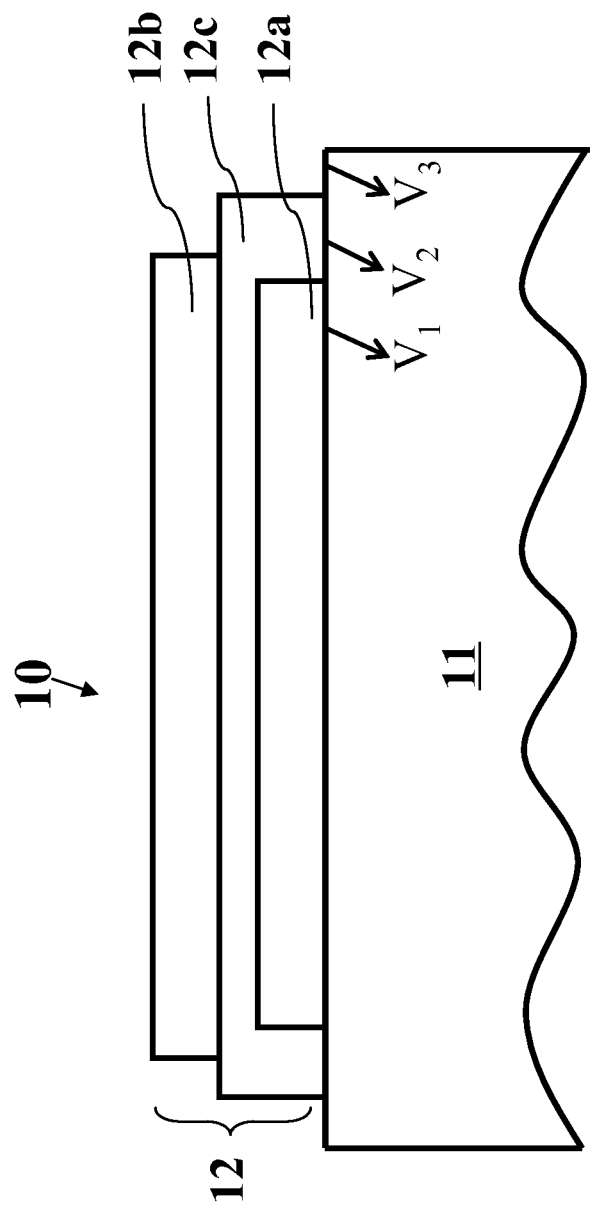
FIG. 2 is a cross-sectional view of an LED chip with a p electrode comprising metal migration barrier layer (protective layer) according to U.S. Pat. No. 6,946,685.

One method is to cover one or several barrier layer(s) over the reflecting layer to block the Ag migration, as disclosed in U.S. Pat. No. 6,946,685 (as shown in FIG. 2). FIG. 2 adopts same numeral references to illustrate same portions as in FIG. 1. The difference between FIG. 2 and FIG. 1 is that a barrier layer 12c is added between layers 12a and 12b. Another method is to use a barrier layer made of insulating material to block the metal migration as disclosed in U.S. Pat. No. 6,794,690.

Detailed descriptions will be given with reference to the embodiments and drawings below. The colors, materials and specific structures referred to in the embodiments disclosed herein are not limited to the examples presented here.

Figure 3:
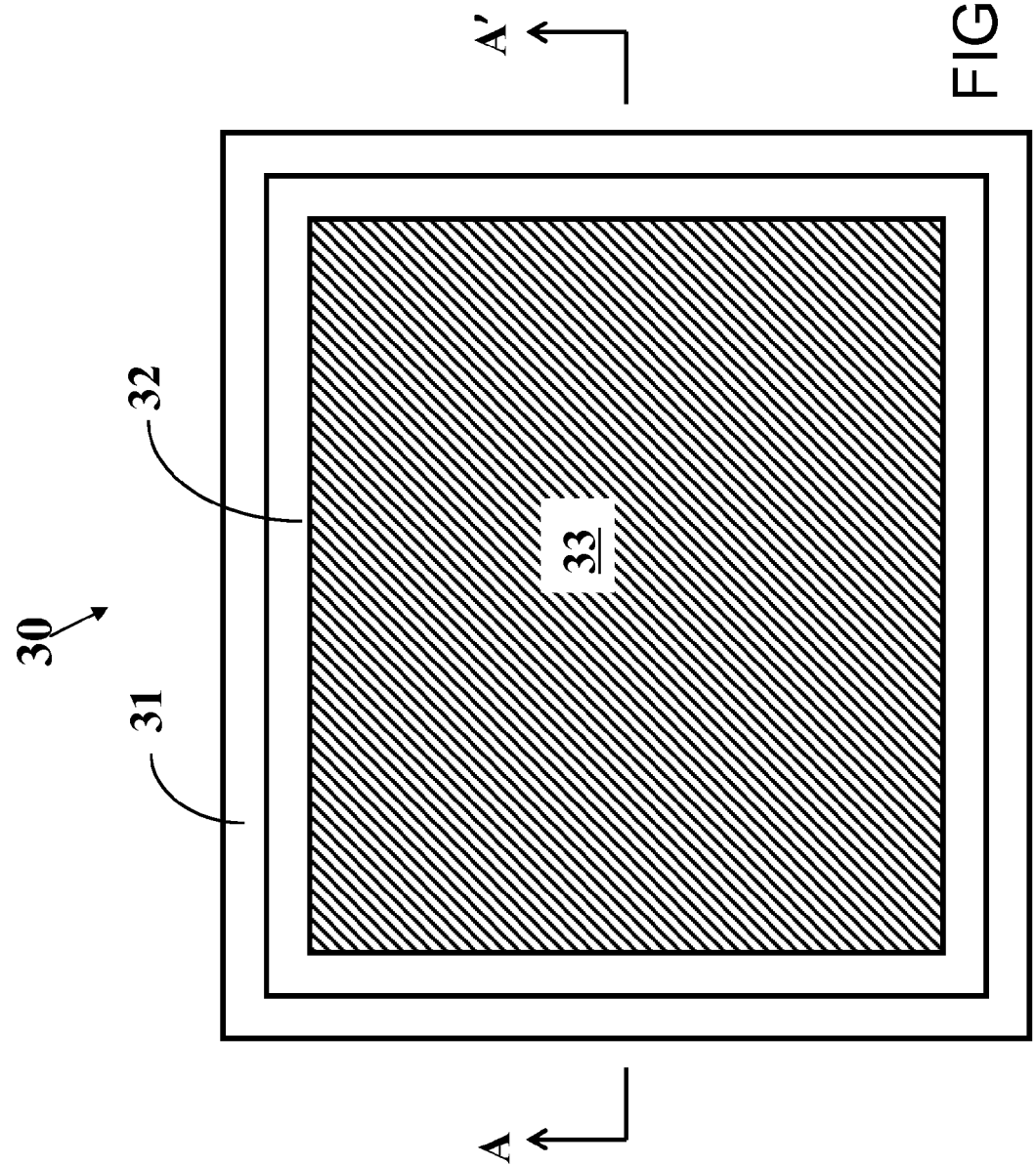
FIG. 3 is a plan view of a p-surface electrode structure of an LED according to some embodiments disclosed herein.
Figure 4:
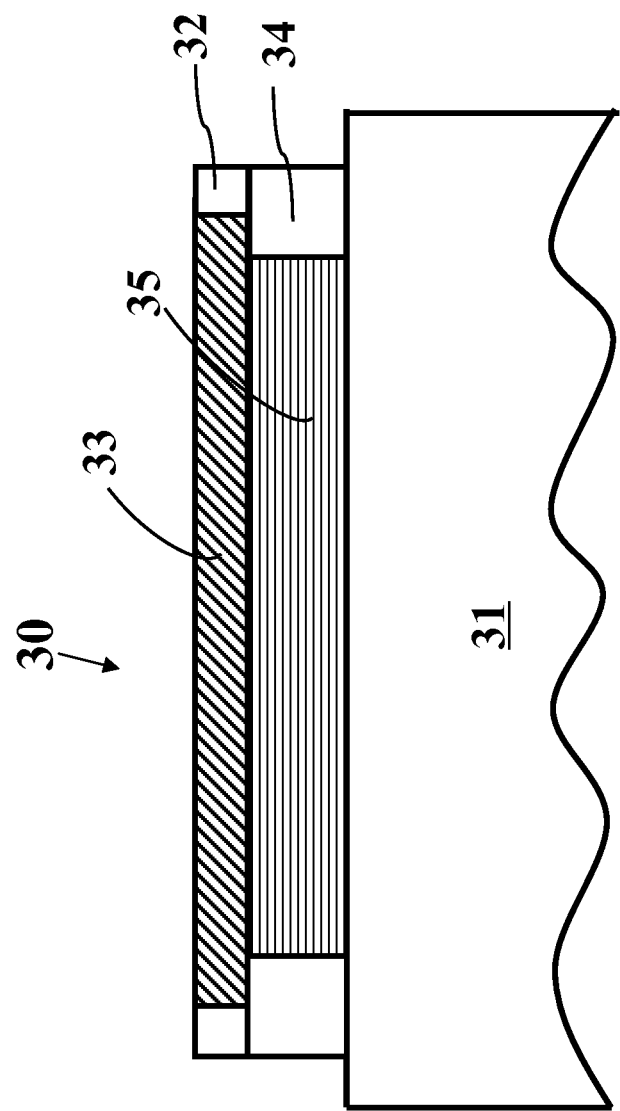
FIG. 4 is a sectional view along line AA' of the LED shown in FIG. 3.

FIG. 3 is a plan view of a first embodiment. FIG. 4 is a cross section along Line AA' in FIG. 3. The active layer, the n-type semiconductor layer and portion of the p-type semiconductor are not shown in FIG. 4. Form the pattern of the reflecting layer 35 over the surface of the p-type semiconductor 31 via first photoetching. Deposit one layer of 500-10000 Å Ag or Ag alloy as the reflecting layer 35 within the pattern scope. Form the pattern of the current steering layer 34 via second photoetching. Deposit one layer of 500-10000 Å Al or Al alloy as the current steering layer 34 within the pattern scope. Form the pattern of the current injection layer 32 via third photoetching. Deposit one layer of 500-5000 Å Au or Au alloy as the current injection layer within the pattern scope. Deposit one layer of 500-5000 Å silicon nitride as the insulating protective layer 33 over the upper surfaces of 34 and 35. In the electrode, the current flows through the current injection layer 32, the current steering layer 34 and the reflecting layer 35 successively, thus guaranteeing that the potential of 34 is higher than 35.

Figure 5:
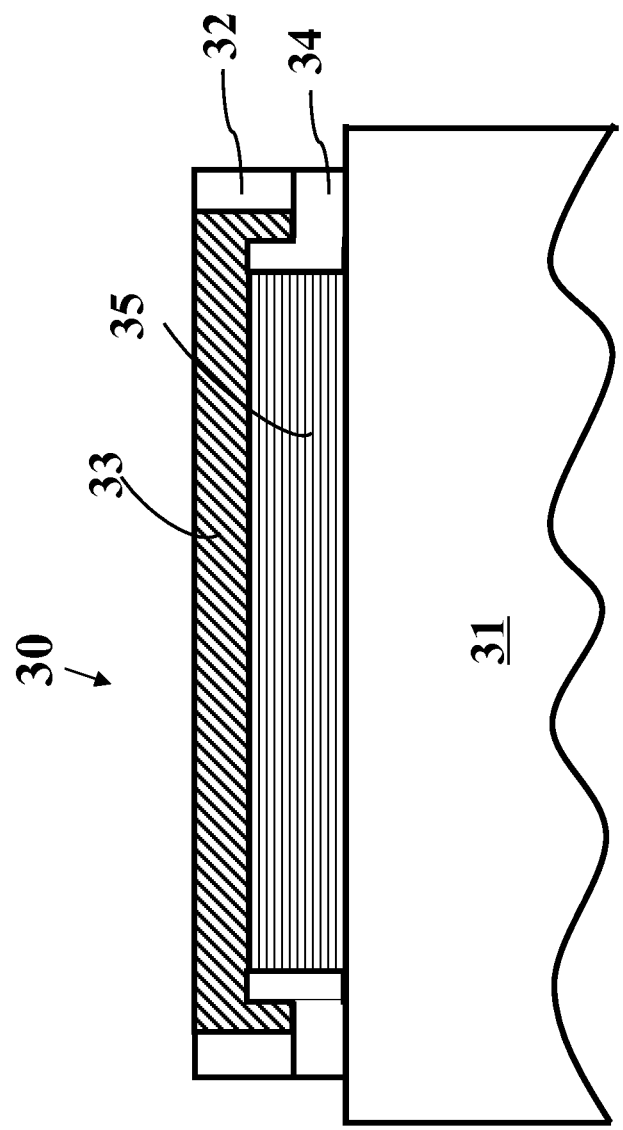
FIG. 5 is a local cross-sectional view an LED chip according to some other embodiments.

FIG. 5 is a cross section of a second embodiment of the present disclosure. Different from Embodiment 1, the current steering layer 34 has a certain gradient due to photoetching, making the current injection layer 32 more closed to the upper layer of the p-type semiconductor. In comparison to Embodiment 1, the potential of the lower surface of the current steering layer in the second embodiment is higher.

Figure 6:
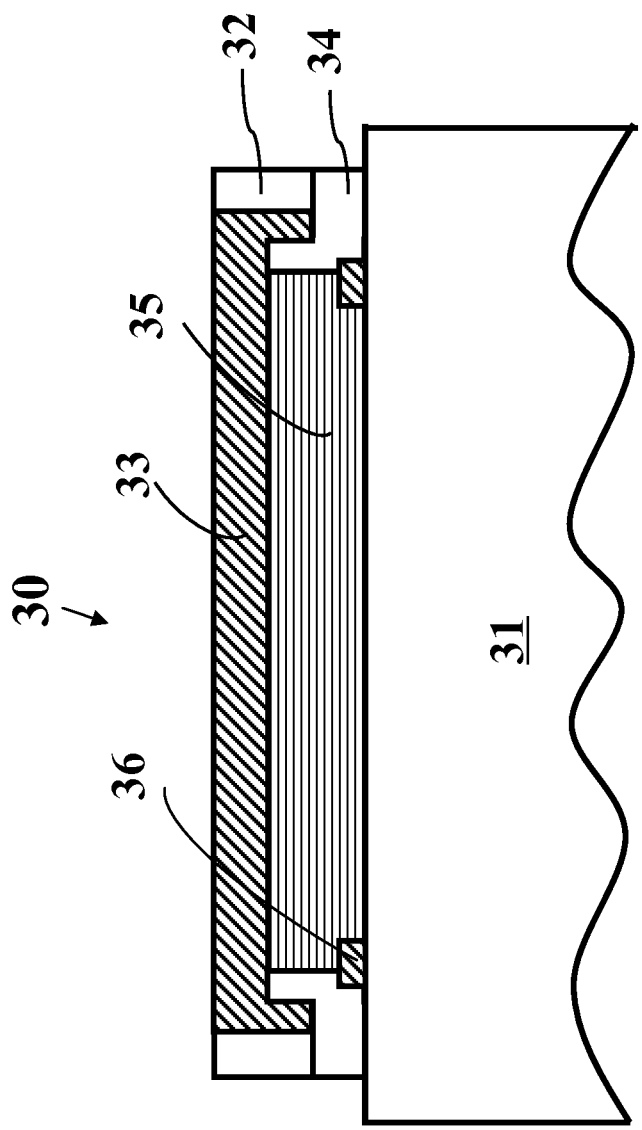
FIG. 6 is a local cross-sectional view of an LED chip according to another embodiment.

FIG. 6 is the cross section of a third embodiment of the present disclosure. Different from the second embodiment, in the third embodiment, deposit a layer of insulating material 36, e.g., silicon nitride, silicon oxide and aluminum nitride over the place where the current steering layer 34 of the p-type semiconductor upper surface contacts with the reflecting layer 35. Then, fabricate the reflecting layer, the current steering layer, the current injection layer, etc. In the third embodiment, the portion where the insulating material 36 contacts with the p-type semiconductor would form a potential trough due to high resistance of the p-type semiconductor, the potential of which is much lower than the current steering layer 34, thus achieving better inhibiting effect for the Ag migration.

Figure 7:
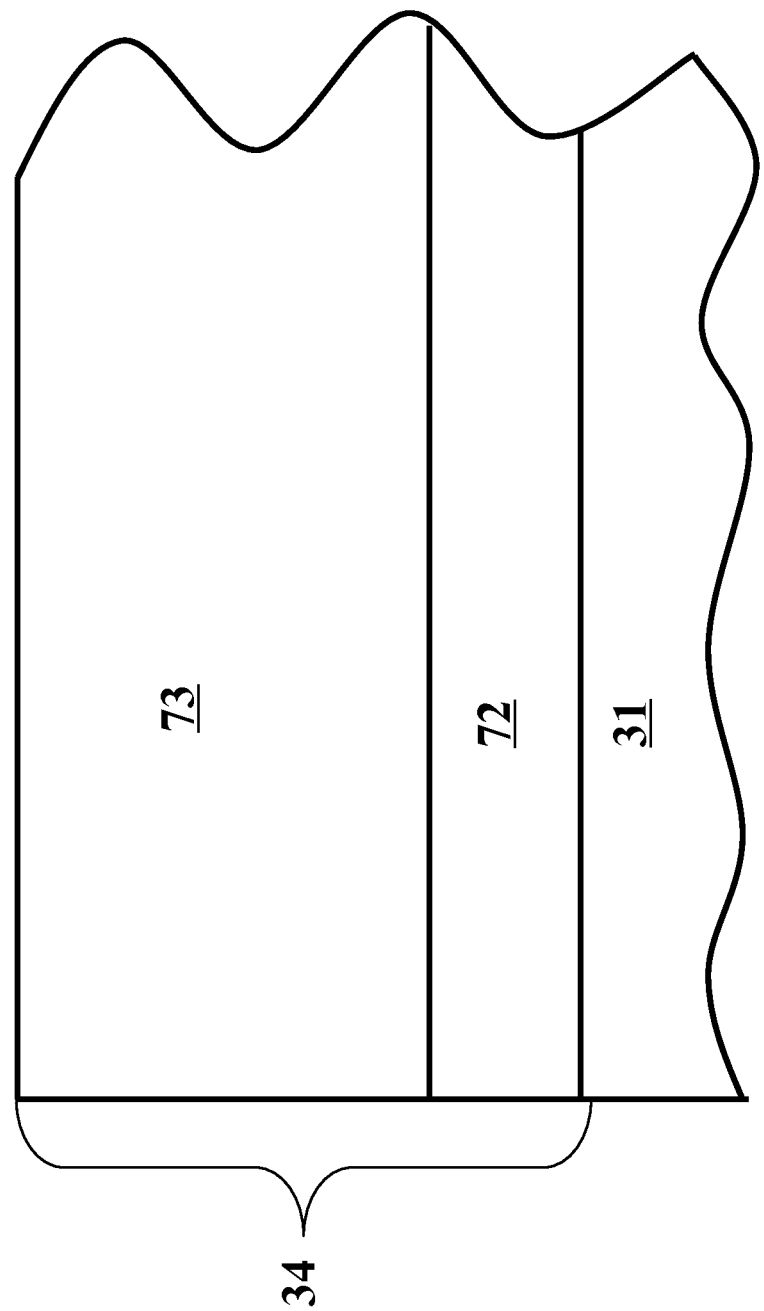
FIG. 7 is a local cross-sectional view of a current steering portion according to some embodiments.

FIG. 7 is a local section view of the current steering layer 34 according to one embodiment. The current steering layer 34 contacts with the p-type semiconductor layer. The current steering layer 34 contains material not vulnerable to electromigration with reflectivity >75%, including two layers of material 72 and 73. 72 is Al or Al alloy, and the 73 is bonding material like Ti, Cr, Pt, Au or metal alloy.

Figure 8:
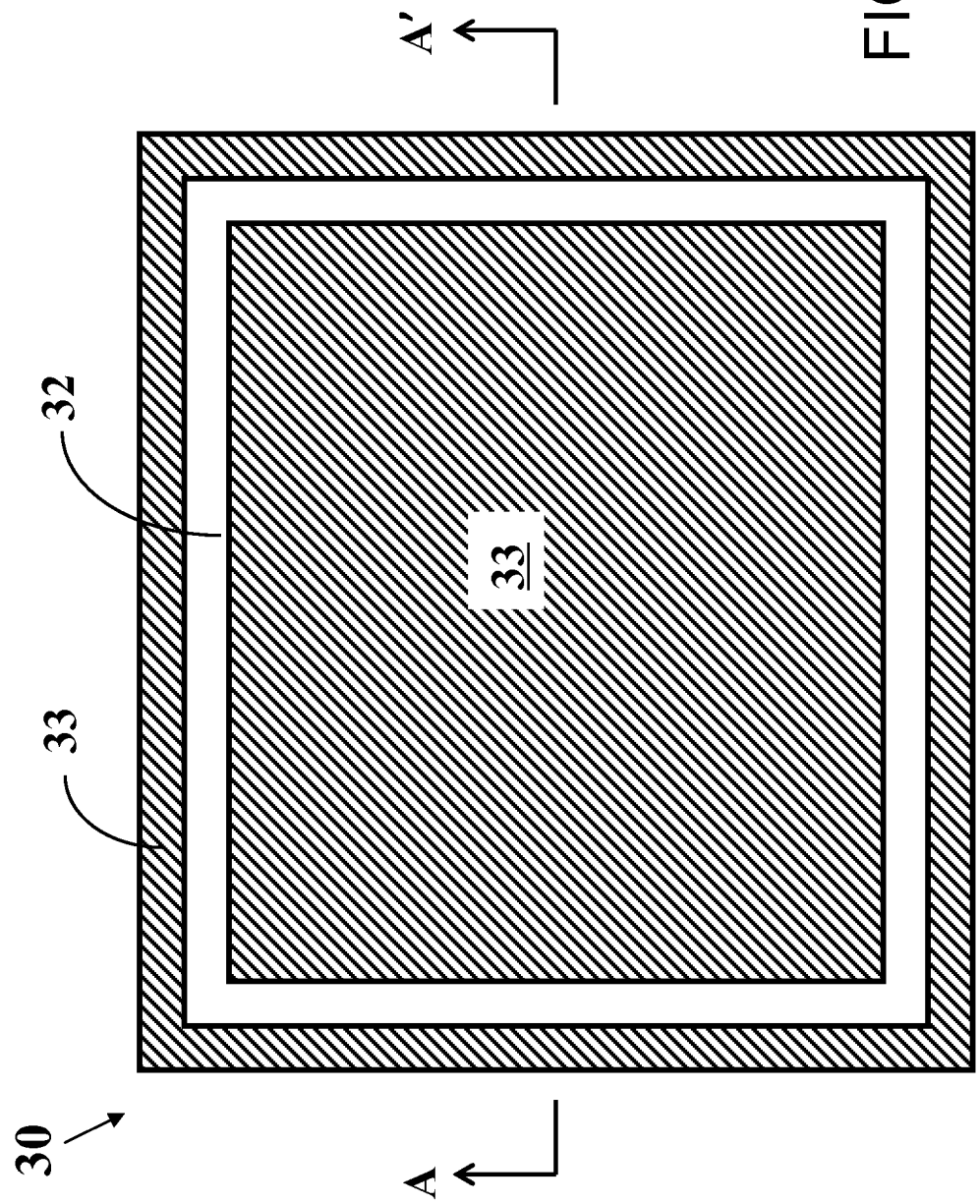
FIG. 8 is a plan of a p-surface electrode structure of an LED according to some embodiments.
Figure 9:
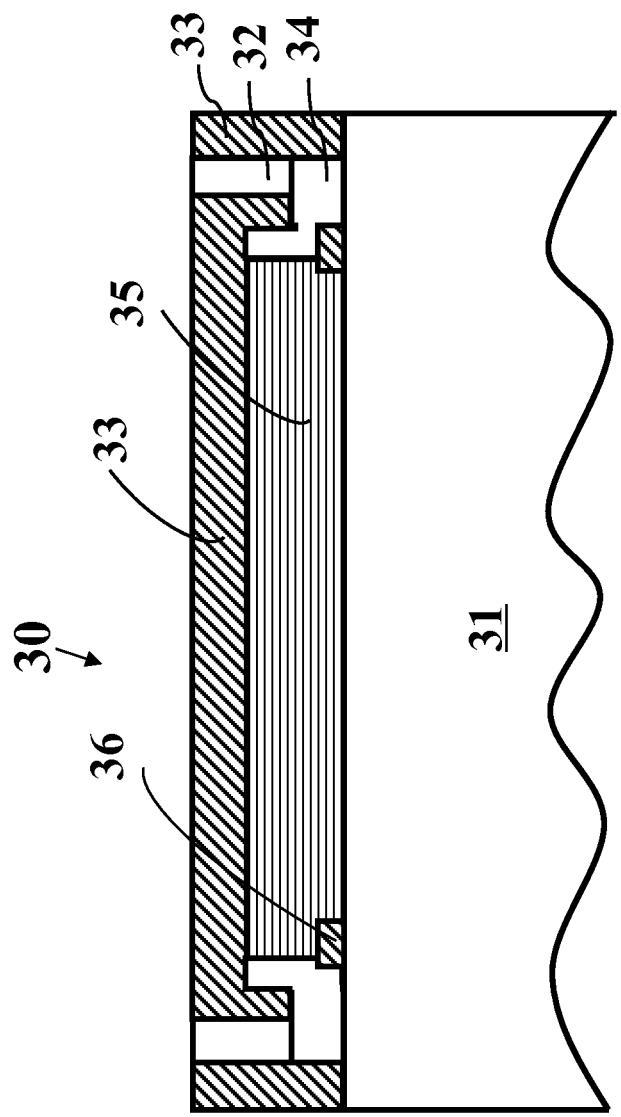
FIG. 9 is a local sectional view along line AA' of the LED shown in FIG. 8.

FIG. 8 is a plan of the Embodiment 4 of the present disclosure. Different from Embodiment 3, in the Embodiment 4, a layer of insulating protective layer covers over the periphery of the electrode. Refer to FIG. 9 for the section view. First, deposit a layer of insulating material 36, e.g., silicon nitride, silicon oxide and aluminum nitride over the place where the current steering layer 34 of the p-type semiconductor upper surface contacts with the reflecting layer 35; then, fabricate the reflecting layer, the current steering layer, the current injection layer, etc.; finally, deposit a layer of 500-5000 Å silicon nitride as the insulating protective layer 33 over the exposed p-type semiconductor layer, the current steering layer 34 and the reflecting layer 35. In this way, the electrode can be protected from pollution and leakage.

Figure 10:
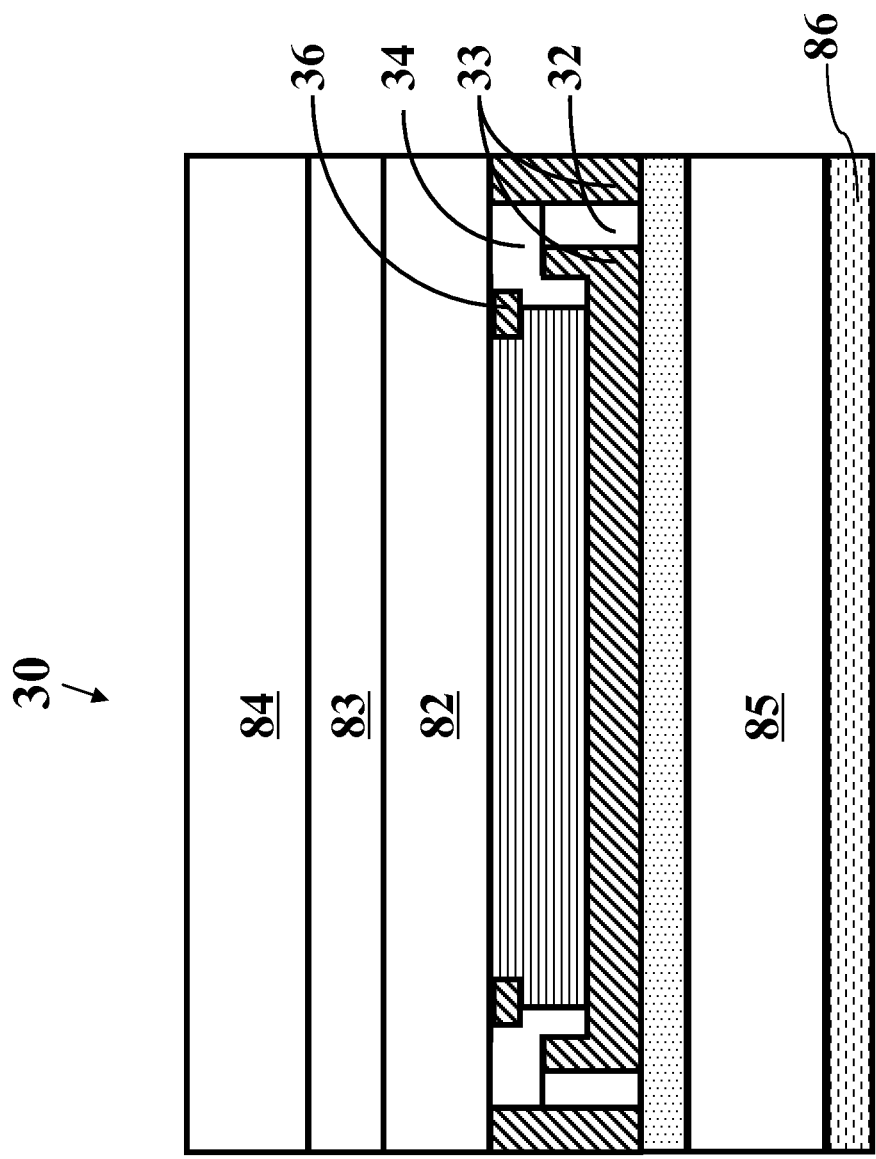
FIG. 10 is a cross-sectional view of a vertical-structure LED chip according to some embodiments.

FIG. 10 is a section view of a vertical structure LED according to Embodiment 4 of the present disclosure. Taking epitaxial growth of a GaN-based light-emitting device over a sapphire substrate as example, first, deposit a light-emitting semiconductor structure over the sapphire substrate via epitaxial growth, generally comprising a P—GaN layer 82, an active layer 83 and an N—GaN layer 84 from up to bottom; then, fabricate an electrode structure over the p-GaN layer 82 following the method of Embodiment 4; then, inversely bond the light-emitting semiconductor structure over the heat-dissipation conducting substrate 85 via bonding process and fabricate a back electrode 86 in a back-to-back manner; and finally remove the sapphire substrate.

Figure 11:
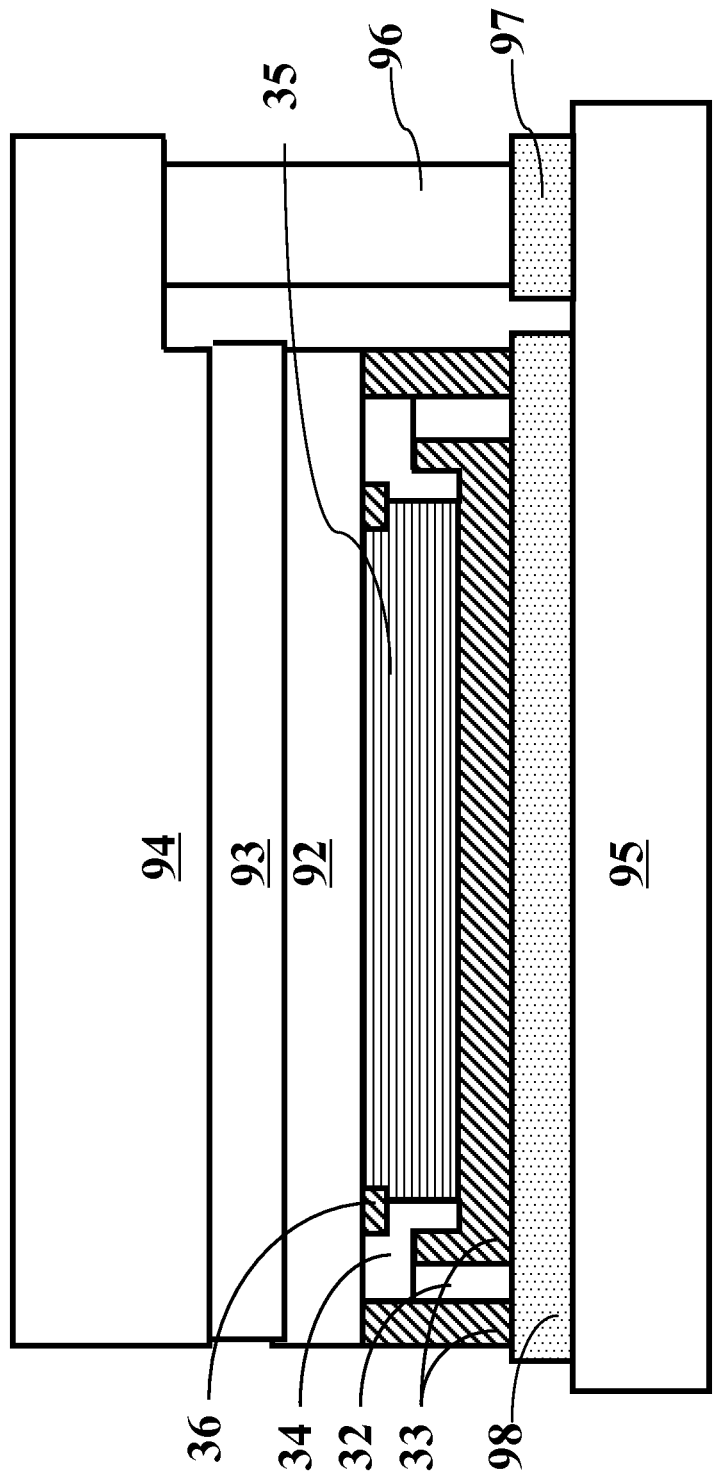
FIG. 11 is a cross-sectional view of a flip-chip LED according to some implementations.

FIG. 11 is a section view of a flip-chip structure LED according to Embodiment 4 of the present disclosure. Similar to the vertical-structure LED, in this embodiment, after formation of the light-emitting semiconductor structure, define a light-emitting mesa over the P—GaN layer 92 with photomask; etch part of the P—GaN layer 92 and the active layer 93 to expose a portion of N—GaN layer 94; fabricate a p electrode structure over the p-GaN layer 82 following the method in Embodiment 4; fabricate the n electrode 96 over the exposed N—GaN layer 94 surface; inversely bond the light-emitting semiconductor structure over the heat-dissipation substrate 95 via bonding process, wherein, the p electrode and the n electrode are connected with the patterned metal layers 98 and 97 over the substrate respectively.

All references referred to in the present disclosure are incorporated by reference in their entirety. Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A light-emitting device, comprising:
   a semiconductor structure with a plurality of semiconductor layers, including a light-emitting layer disposed between two of the plurality of semiconductor layers;
   at least one electrode with a reflecting layer, wherein the electrode has a contact surface with at least one semiconductor layer of the semiconductor structure;
   wherein if a forward bias is applied to the light-emitting device, a corresponding current flows to the reflecting layer from substantially only one or more side surfaces of the reflecting layer, generating a potential gradient at the contact surface, thereby suppressing electromigration of a metal in the electrode.

2. The light-emitting device of claim 1, wherein the electrode further comprises a current steering layer in electrical connection with only the one or more side surfaces of the reflecting layer, and wherein if the forward bias is applied, the current flows to the reflecting layer through the current steering layer surrounding the reflecting layer.

3. The light-emitting device of claim 2, wherein a potential of a contact surface between the current steering layer and the semiconductor structure is higher than a potential of a contact surface between the reflecting layer and the semiconductor structure.

4. The light-emitting device of claim 2, wherein the current steering layer comprises a high reflectivity material not vulnerable to electromigration and with a reflectivity >75%.

5. The light-emitting device of claim 2, wherein a portion of the electrode not for conducting has its surface covered by an insulating material.

6. A light-emitting system comprising a plurality of light-emitting devices, each device comprising:
   a semiconductor structure including a P-type semiconductor layer, an N-type semiconductor layer, and a light-emitting layer between the P-type semiconductor layer and the N-type semiconductor layer;
   an electrode including a current injection layer, a current steering layer, and a reflecting layer, wherein the current steering layer is disposed substantially only at a periphery of the reflecting layer, has at least a portion forming a contact surface with the reflecting layer, and forms an electric connection with only a side surface of the reflecting layer;
   wherein in a case of forward conduction, a current flows to the reflecting layer through the current steering layer surrounding the reflecting layer, generating a potential gradient at the contact surface, thereby suppressing electromigration of a metal in the electrode.

7. The system of claim 6, wherein at least a portion of the current steering layer and the reflecting layer is in contact with the semiconductor structure, and wherein the current injection layer is in contact with the current steering layer but not with the reflecting layer.

8. The system of claim 7, wherein in the case of forward conduction, the electrode has a current that flows in sequence through the current injection layer, the current steering layer and the reflecting layer.

9. The system of claim 7, wherein a potential of a contact surface between the current steering layer and the semiconductor structure is higher than a potential of a contact surface between the reflecting layer and the semiconductor structure.

10. The system of claim 6, wherein the current steering layer comprises a plurality of layers including at least one layer of Al.

11. The system of claim 6, wherein a portion of adjacent side surfaces of the current steering layer and the reflecting layer at the semiconductor structure side is blocked by an insulating material, while remaining portions are in contact.

12. The system of claim 6, wherein side surfaces of the current steering layer and the reflecting layer are in complete contact, and a sectional profile of the current steering layer has a preset gradient.

\* \* \* \* \*